(12) United States Patent
Park et al.

(10) Patent No.: US 8,564,005 B2
(45) Date of Patent: Oct. 22, 2013

(54) LIGHT-EMITTING DEVICE PACKAGE

(75) Inventors: Jong-kil Park, Gyeonggi-do (KR);
Jae-sung You, Gyeonggi-do (KR);
Sung-uk Zhang, Gyeonggi-do (KR);
Tae-gyu Kim, Gyeonggi-do (KR);
Bang-weon Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/347,163

(22) Filed: Jan. 10, 2012

(65) Prior Publication Data

US 2012/0181559 A1 Jul. 19, 2012

(30) Foreign Application Priority Data

Jan. 13, 2011 (KR) .................. 10-2011-0003556

(51) Int. Cl.
*H01L 33/50* (2010.01)
(52) U.S. Cl.
USPC ............. 257/98; 257/E33.061; 257/E33.074
(58) Field of Classification Search
USPC ............ 257/98, E33.056, E33.059, E33.061, 257/E33.074
See application file for complete search history.

(56) References Cited

U.S. PATENT DOCUMENTS

| | | | |
|---|---|---|---|
| 8,035,119 B2* | 10/2011 | Ng et al. | 257/98 |
| 8,324,641 B2* | 12/2012 | Yan et al. | 257/98 |
| 2010/0133555 A1* | 6/2010 | Negley | 257/88 |

FOREIGN PATENT DOCUMENTS

| | | | |
|---|---|---|---|
| KR | 10-2007-0024603 A | | 3/2007 |
| KR | 10-2009-0007024 A | | 1/2009 |
| KR | 10-2009-0017346 A | | 2/2009 |

* cited by examiner

*Primary Examiner* — Zandra Smith
*Assistant Examiner* — Paul Patton
(74) *Attorney, Agent, or Firm* — McDermott Will & Emery LLP

(57) ABSTRACT

A light-emitting device package including: a package main body including a cavity and a lead frame including a mounting portion disposed in the cavity and a plurality of terminal portions; a light-emitting device chip mounted on the mounting portion; a plurality of bonding wires for electrically connecting the plurality of terminal portions and the light-emitting device chip; a light-transmitting encapsulation layer filled in the cavity; and a light-transmitting cap member disposed in the cavity and blocking the encapsulation layer to contact the plurality of bonding wires.

13 Claims, 6 Drawing Sheets

LIGHT-EMITTING DEVICE PACKAGE

CROSS-REFERENCE TO RELATED APPLICATIONS

This application claims the benefit of Korean Patent Application No. 10-2011-0003556, filed on Jan. 13, 2011, in the Korean Intellectual Property Office, the disclosure of which is incorporated herein in its entirety by reference.

BACKGROUND

1. Field

The present disclosure relates to light-emitting device packages in which light-emitting device chips are mounted on a lead frame and a mold frame or a circuit board.

2. Description of the Related Art

Light-emitting device chips, for example, light-emitting diode (LED) chips, are semiconductor devices that emit light of various colors by forming a light-emitting source through a PN-junction of compound semiconductors. Light-emitting diodes (LEDs) have a long life-span, a thin profile, and light weight. Also, LEDs have strong directivity of light and thus may be driven at a low voltage. In addition, LEDs have anti-shock and anti-vibration characteristics and do not require a warming-up time and complicated driving. LEDs may be packaged in various forms and thus may be easily used for various purposes.

Light-emitting device chips, such as LED chips, are manufactured as a light-emitting device package after a packaging operation in which the light-emitting device chips are mounted on a metal lead frame and a mold frame or a circuit board.

SUMMARY

Provided are light-emitting device packages having durability of bonding wires and stability of electrical connection.

Also provided are light-emitting device packages having a wide directional angle.

Additional aspects will be set forth in part in the description which follows and, in part, will be apparent from the description, or may be learned by practice of the presented embodiments.

According to an aspect of the present invention, a light-emitting device package includes: a package main body including a cavity and a lead frame including a mounting portion disposed in the cavity and a plurality of terminal portions; a light-emitting device chip mounted on the mounting portion; a plurality of bonding wires for electrically connecting the plurality of terminal portions and the light-emitting device chip; a light-transmitting encapsulation layer filled in the cavity; and a light-transmitting cap member disposed in the cavity and blocking the encapsulation layer to contact the plurality of bonding wires.

According to another aspect of the present invention, a light-emitting device package includes: a package main body including an upper frame including a cavity and a lead frame including a mounting portion forming a lower structure of the cavity and a plurality of terminal portions; a light-emitting device chip mounted on the mounting portion and electrically connected to the plurality of terminal portions via a plurality of bonding wires; a light-transmitting cap member dividing the cavity into a lower space occupied by the plurality of bonding wires and filled with air and an upper space above the lower space; and a refractive index-matching layer formed on an upper surface of the light-emitting device chip and having a refractive index that is smaller than that of the light-emitting device chip and greater than that of air.

A fluorescent substance that converts light emitted from the light-emitting device chip into a predetermined light color may be dispersed into the refractive index-matching layer.

The light-emitting device package may further include a light-transmitting encapsulation layer disposed in the upper space.

A fluorescent substance that converts light emitted from the light-emitting device chip into a predetermined light color may be included in the light-transmitting encapsulation layer.

Bubbles may be included in the light-transmitting encapsulation layer.

The encapsulation layer may include a first encapsulation layer disposed on an upper portion of the light-transmitting cap member and including bubbles, and a second encapsulation layer disposed on the first encapsulation layer and including no bubbles. A fluorescent substance that converts light emitted from the light-emitting device chip into a predetermined light color may be included in at least one of the first and second encapsulation layers.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
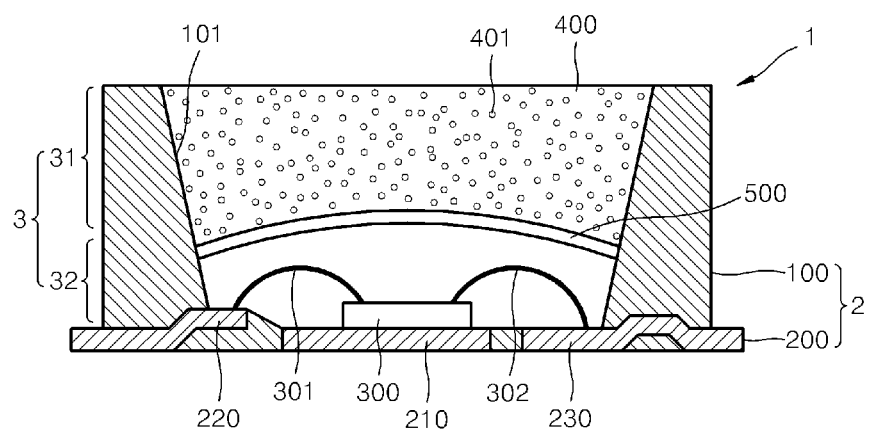
FIG. 1 is a cross-sectional view of a light-emitting device package according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a cross-sectional view of a light-emitting device package 1 according to an embodiment of the present invention. Referring to FIG. 1, the light-emitting device package 1 includes a package main body 2 having a cavity 3 in which a light-emitting device chip 300 is mounted.

The light-emitting device chip 300 may be a light-emitting diode (LED) chip. The LED chip may emit blue light, green light, red light, or the like depending on a material used to form a compound semiconductor of the LED chip. For example, a blue LED chip may include an active layer having a plurality of quantum well layers in which gallium nitride (GaN) and indium gallium nitride (InGaN) are alternately formed. The blue LED chip may further include a P-type cladding layer and an N-type cladding layer, which are respectively formed on upper and lower surfaces of the active layer by using a compound semiconductor of $Al_XGa_YN_Z$. In addition, the LED chip may emit ultraviolet rays having no color. In the present embodiment, the light-emitting device chip 300 is an LED chip. However, an aspect of the present invention is not limited thereto, and for example, the light-emitting device chip 300 may be a UV photodiode chip, a laser diode chip, an organic light-emitting diode (OLED) chip, or the like.

The package main body 2 may include a conductive lead frame 200 and an upper frame 100. The lead frame 200 may include a mounting portion 210 on which the light-emitting device chip 300 is mounted and first and second terminal portions 220 and 230 that are electrically connected to the light-emitting device chip 300 by wire bonding. For example, the first and second terminal portions 220 and 230 may be connected to a cathode and an anode of the light-emitting device chip 300 by bonding wires 301 and 302, respectively. The first and second terminal portions 220 and 230 act as terminals that are exposed to the outside of the upper frame 100 and supply current to the light-emitting device chip 300. The lead frame 200 may be manufactured by performing pressing, etching, or the like on a conductive metal plate formed of metal, such as aluminum or copper.

The upper frame 100 may be a mold frame attached to the lead frame 200 by performing an insert molding process, for example. The upper frame 100 may be formed of electrical insulating polymer, for example. The upper frame 100 is formed in a concave form in which the mounting portion 210 and the first and second terminal portions 220 and 230 are exposed. Thus, the cavity 3 is formed in the package main body 2. The mounting portion 210 and the first and second terminal portions 220 and 230 constitute a lower structure of the cavity 3.

An inside 101 of the cavity 3 may be a reflection face on which light emitted from the light-emitting device chip 300 is reflected and is emitted from the light-emitting device package 1. To this end, a material having high light reflectivity, for example, silver (Ag), aluminum (Al), platinum (Pt), titanium (Ti), chromium (Cr), copper (Cu), or the like, may be coated or deposited on the inside 101 of the cavity 3. As an alternative, a plate formed of the above-described materials may be bonded to the inside 101 of the cavity 3. As another alternative, at least a portion of the inside 101 of the cavity 3 may be formed by the lead frame 200.

Thus, the light-emitting device package 1 is shaped in such a way that the light-emitting device chip 300 is disposed on a bottom surface of the cavity, and the inside 101 of the package main body 2 acts as a reflection portion in which light is reflected and is emitted out of the light-emitting device package 1. Bottom surfaces of the mounting portion 210 and the first and second terminal portions 220 and 230 of the lead frame 200 are exposed at a lower portion of the upper frame 100 and may act as heat-dissipating faces.

An encapsulation layer 400 is formed in the cavity 3 by using a light-transmitting resin, such as silicon or the like, so as to protect the light-emitting diode chip 300 and the bonding wires 301 and 302 from the external environment.

When the encapsulation layer 400 is formed completely on the inside 101 of the cavity 3, the bonding wires 301 and 302 are buried by the encapsulation layer 400. When driving of the light-emitting device chip 300 starts, the bonding wires 301 and 302 and the encapsulation layer 400 thermally expand by heat generated in the light-emitting device chip 300. In this case, due to a difference in thermal expansion coefficients between the bonding wires 301 and 302 and the encapsulation layer 400, there is stress on the bonding wires 301 and 302. This also applies to the case when driving of the light-emitting device chip 300 is completed and the light-emitting device chip 300 is cooled down. Due to the stress caused by a difference in thermal expansion coefficients between the bonding wires 301 and 302 and the encapsulation layer 400, which repetitively thermally expand and contract, the bonding wires 301 and 302 may sever. In addition, the bonding wires 301 and 302 are bonded to electrodes of the light-emitting device chip 300 and the first and second terminal portions 220 and 230, respectively. When stress due to the difference in thermal expansion coefficients between the bonding wires 301 and 302 and the encapsulation layer 400 is repeatedly applied to the bonding wires 301 and 302, bonded portions of the bonding wires 301 and 302 may detach from the electrodes of the light-emitting device chip 300.

In order to solve the above-described problem, the light-emitting device package 1 according to the present embodiment includes a light-transmitting cap member 500 to define a space of the encapsulation layer 400 and a space of the bonding wires 301 and 302 and separate the encapsulation layer 400 from the bonding wires 301 and 302. The light-transmitting cap member 500 is formed in the cavity 3 and blocks the encapsulation layer 400 to contact the bonding wires 301 and 302. In detail, the light-transmitting cap member 500 divides the space inside the cavity 3 into a lower space 32, which is occupied by the bonding wires 301 and 302, and an upper space 31.

The light-transmitting cap member 500 is formed of a material having light-transmitting properties. The shape of the light-transmitting cap member 500 is not limited to the dome shape illustrated in FIG. 1, and the light-transmitting cap member 500 may be shaped in any form by which the space inside the cavity 3 may be divided into the lower space 32 and the upper space 31.

Air may be filled in the lower space 32. Air may be intentionally filled in the lower space 32. Also, the light-transmitting cap member 500 is formed in the cavity 3, and the encapsulation layer 400 is formed in the upper space 31 during a process of manufacturing the light-emitting device package 1 such that air may be naturally in the lower space 32. In this way, the bonding wires 301 and 302 are disposed in a space to be separate from the encapsulation layer 400 such that stress due to thermal expansion and contraction of the encapsulation layer 400 may not be applied to the bonding wires 301 and 302. Thus, the bonding wires 301 and 302 thermally-expand or contract in the lower space 32 and stress on the bonding wires 301 and 302 may be reduced, and thus, and the life-span of the light-emitting device package 1 may be increased.

Light emitted from the light-emitting device chip 300, in particular, from the LED, has directivity and thus has a narrow directional angle and shows a dazzling phenomenon. In order to use the light-emitting device package 1 in lighting units that have replaced traditional lighting units, such as an incandescent lamp, a fluorescent lamp, and the like, a wide directional angle is required and the dazzling phenomenon needs to be reduced. To this end, a lens or a diffusion plate is used in lighting units that employ the light-emitting device package 1 so as to widen a directional angle of light. In this regard, additional cost and efforts are necessary to optimize the performance of the lens or diffusion plate.

The light-emitting device package 1 according to the present embodiment employs the encapsulation layer 400 including bubbles 401. Light is emitted from the light-emitting device chip 300 via the light-transmitting cap member 500 and the encapsulation layer 400. In this regard, light is scattered due to the bubbles 401 in the encapsulation layer 400. Thus, the light-emitting device package 1 may be implemented to have a wide directional angle. In addition, even when a lens or a diffusion plate is further employed in lighting units that employ the light-emitting device package 1 so as to widen a directional angle of light, a degree of freedom for optimizing the performance of the lens or diffusion plate may be increased compared to the related art. In addition, directivity of light is reduced due to the scattering and thus reduce the dazzling phenomenon.

The encapsulation layer 400 may include a fluorescent substance that converts light emitted from the light-emitting device chip 300 into a desired light color. The fluorescent substance may be formed of a single material or materials mixed at a predetermined ratio.

Figure 2:
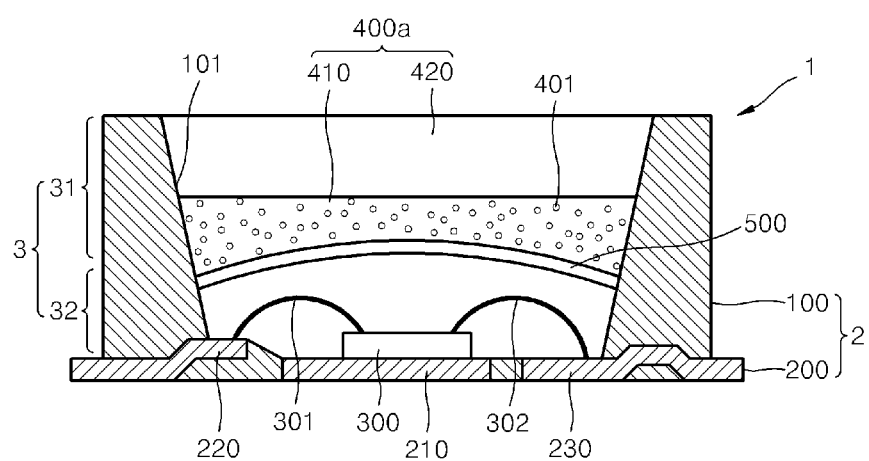
FIG. 2 is a cross-sectional view of a light-emitting device package according to another embodiment of the present invention.

As illustrated in FIG. 2, an encapsulation layer 400a may include a first encapsulation layer 410 and a second encapsulation layer 420 formed on the first encapsulation layer 410. The first encapsulation layer 410 is a light-transmitting layer in which bubbles 401 are included, and the second encapsulation layer 420 is a light-transmitting layer in which bubbles 401 are not included. Since the first encapsulation layer 410 including the bubbles 401 may have an uneven surface, the second encapsulation layer 420 having no bubbles 401 is formed on the first encapsulation layer 410 so that the surface of the encapsulation layer 400 may be even. A fluorescent substance may be contained in at least one of the first and second encapsulation layers 410 and 420.

Figure 3:
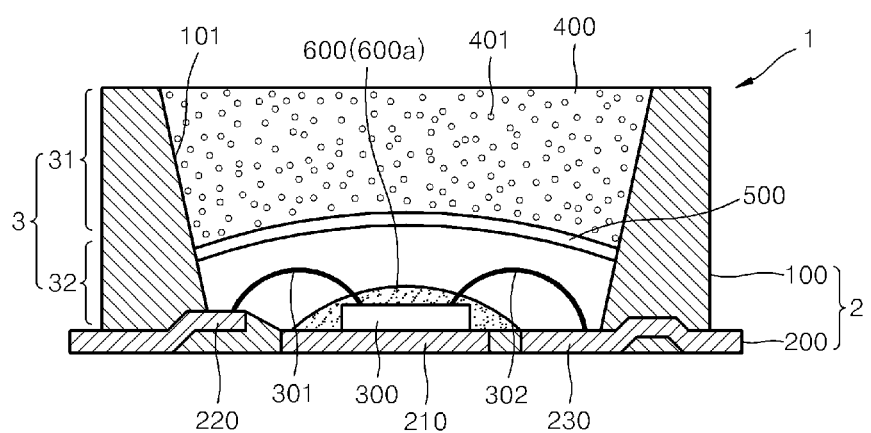
FIG. 3 is a cross-sectional view of a light-emitting device package according to another embodiment of the present invention.

As another alternative for converting light emitted from the light-emitting device chip 330 into a desired light color, a fluorescent layer 600 may be formed on the light-emitting device chip 300, as illustrated in FIG. 3. The fluorescent layer 600 may be a fluorescent substance-containing resin in which a fluorescent substance is mixed with a binder resin. The fluorescent layer 600 may be formed of a single material or materials mixed at a predetermined ratio. Polymer that satisfies characteristics, such as high adhesion, high light transmittance, high heat resistance, high light refractive index, excess water tolerance, and the like, may be used as the binder resin. For example, an epoxy-based resin or silicon that is inorganic polymer. A silane-based material, for example, may be mixed with the binder resin as an additive for improving an adhesion property. Also, various additives may be mixed with the binder resin according to use. The fluorescent layer 600 may be formed by coating fluorescent substance-containing polymer at a predetermined position and by curing it.

When light passes through two mediums having different refractive indexes, total reflection may occur at a boundary face between the two mediums. When light proceeds from a high-refractive index medium to a low-refractive index medium, the amount of total reflection is increased as a difference in refractive indexes between the high-refractive index medium and the low-refractive index medium increases. Air filled in the lower space 32 is a low-refractive index medium having a refractive index that is much lower than that of the light-emitting device chip 300. Thus, total reflection may occur at a boundary face between the light-emitting device chip 300 and air such that emission efficiency of light emitted from the light-emitting device chip 300 may be lowered. The fluorescent layer 600 may act as a refractive index-matching medium between a high-refractive index medium and a low-refractive index medium. In detail, the refractive index of the fluorescent layer 600 is between the refractive index of the light-emitting device chip 300 and the refractive index of air such that emission efficiency of light emitted from the light-emitting device chip 300 into the lower space 32 may be improved. The binder resin is properly selected so that the refractive index of the fluorescent layer 600 may be between the refractive index of the light-emitting device chip 300 and the refractive index of air.

When the fluorescent substance is included in the encapsulation layer 400, the refractive index-matching layer may be formed on the light-emitting device chip 300, as indicated by reference numeral 600a in FIG. 3. The refractive index-matching layer 600a may be formed by applying or coating a light-transmitting material having a refractive index that is between the refractive index of the light-emitting device chip 300 and the refractive index of air on the light-emitting device chip 300. When the fluorescent substance is not included in the encapsulation layer 400, the fluorescent substance may be included in the refractive index-matching layer 600a.

The fluorescent layer 600 or the refractive index-matching layer 600a may also be applied to the embodiment of FIG. 2. In this case, when the fluorescent substance is not included in the first and second encapsulation layers 410 and 420, the fluorescent layer 600 or the refractive index-matching layer 600a including a fluorescent substance may be applied to the embodiment of FIG. 2. When the fluorescent substance is included in one of the first and second encapsulation layers 410 and 420, the refractive index-matching g layer 600a may be applied to the embodiment of FIG. 2.

Hereinafter, a method of manufacturing the light-emitting device package 1, according to an embodiment of the present invention, will be described.

Figure 4:
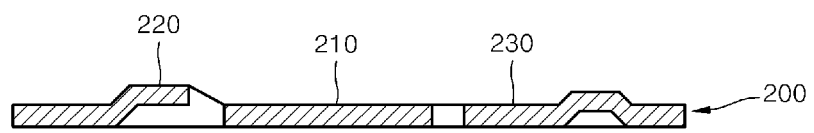
FIG. 4 is a cross-sectional view illustrating an operation of forming a lead frame of a method of manufacturing a light-emitting device package, according to an embodiment of the present invention.

Referring to FIG. 4, the lead frame 200, including the mounting portion 210 and the first and second terminal portions 220 and 230, is formed by performing pressing, etching, or the like on a metal plate formed of aluminum (Al) or copper (Cu). A washing process of removing foreign substances that remain on the lead frame 200 may be performed before an insert molding process, which will be described below, is performed. In addition, a plating process for surface processing of the lead frame 200 may be performed.

Figure 5:
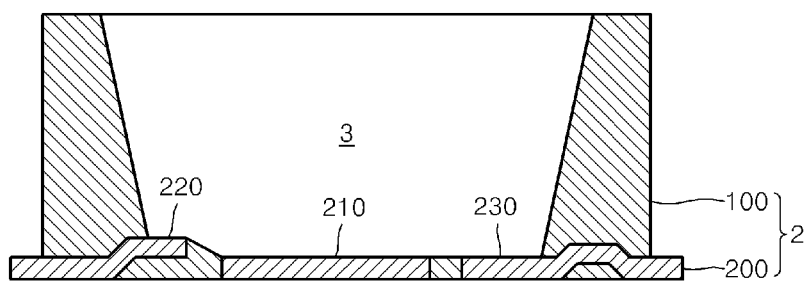
FIG. 5 is a cross-sectional view illustrating an operation of coupling an upper frame to the lead frame of the method of manufacturing a light-emitting device package.

Next, the upper frame 100 is attached to the lead frame 200. The upper frame 100 may be formed by performing an insert molding process on polymer, such as polyphthal amide (PPA), liquid crystal polymer (LCP), or the like. Thus, the package main body 2 having the cavity 3 is formed, as illustrated in FIG. 5. The lead frame 200 constitutes a lower structure of the cavity 3.

Figure 6:
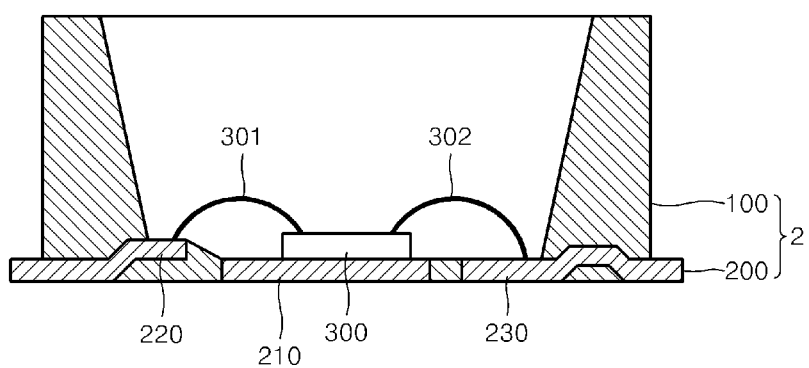
FIG. 6 is a cross-sectional view illustrating a wire bonding process of the method of manufacturing a light-emitting device package.

Next, the light-emitting device chip 300 is mounted on the mounting portion 210, as illustrated in FIG. 6. The light-emitting device chip 300 may be attached to the mounting portion 210 by using an adhesive, for example. Then, the first and second terminal portions 220 and 230 and a cathode and an anode of the light-emitting device chip 300 are respectively connected to each other via the bonding wires 301 and 302.

Figure 7:
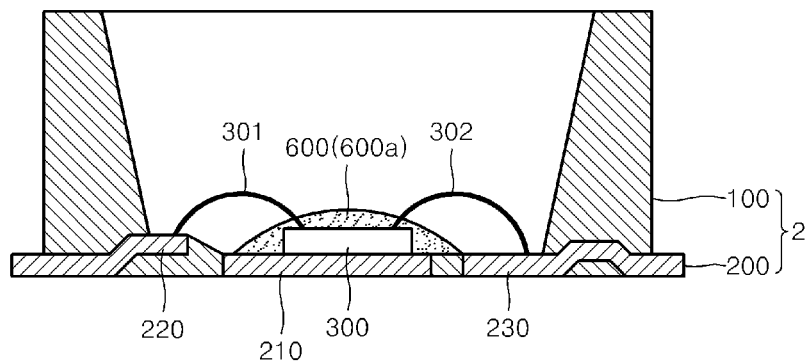
FIG. 7 is a cross-sectional view illustrating an operation of forming a refractive index-matching layer of the method of manufacturing a light-emitting device package.

Next, a fluorescent substance-containing resin or a light-transmitting resin for matching refractive indexes is applied or coated such that the fluorescent layer 600 or the refractive index-matching layer 600a is formed, as illustrated in FIG. 7.

Figure 8:
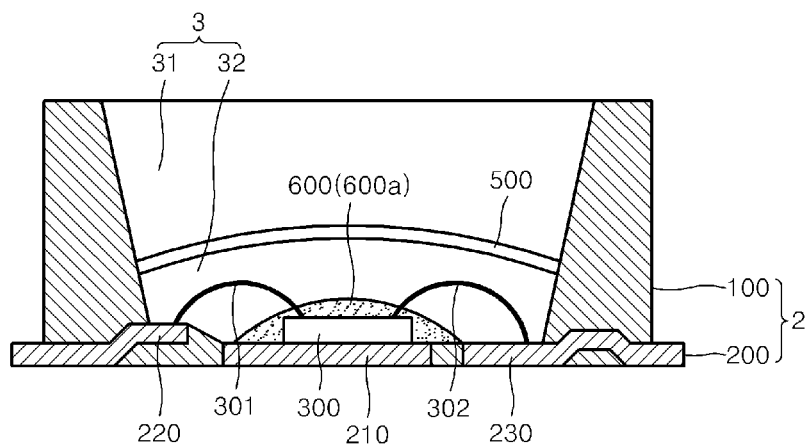
FIG. 8 is a cross-sectional view illustrating an operation of dividing a cavity by using a cap element of the method of manufacturing a light-emitting device package.

Next, the light-transmitting cap member 500 is formed in the cavity 3 so that space in the cavity 3 may be divided into the lower space 32 and the upper space 31, as illustrated in FIG. 8.

Next, the encapsulation layer 400 or 400a is formed in the upper space 31. For example, a molding material in which transparent silicon is dispersed into a volatile solvent such as toluene, is filled in the upper space 31 and then is dried and cured. Air is filled in the space that remains after the solvent is volatilized during the drying and curing process, and the encapsulation layer 400 including bubbles 401 is formed in the upper space 31. As another example, the encapsulation layer 400 including the bubbles 401 may also be formed by injecting and curing transparent foam silicon into the upper space 31 of the cavity 3.

The first encapsulation layer 410 may be formed by filling the molding material in which transparent foam silicon is dispersed into a volatile solvent, such as toluene, in the upper space 31 and then by drying and curing the molding material, or by injecting and curing transparent foam silicon into the upper space 31, as described above. The second encapsulation layer 420 may be formed by injecting and curing transparent silicon into the first encapsulation layer 410 in a molding manner. By using transparent silicon that contains a fluorescent substance, the second encapsulation layer 420 having a fluorescent layer may also be formed.

In the above-described embodiments, the light-emitting device chip 300 is disposed in the cavity 3, and the light-emitting device package includes the bonding wires 301 and 302. However, aspects of the present invention are not limited thereto. The light-emitting device package may have no cavity 3 or no bonding wires 301 and 302.

Figure 9:
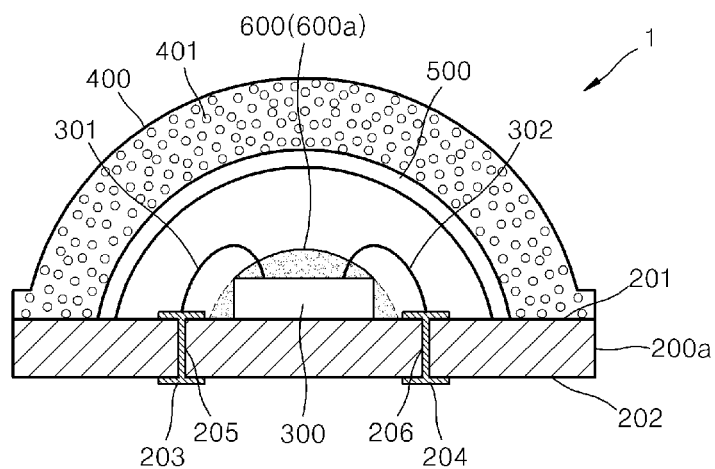
FIG. 9 is a cross-sectional view of a light-emitting device package having no cavity according to another embodiment of the present invention.

FIG. 9 illustrates a light-emitting device package 1 having no cavity 3 according to an embodiment of the present invention. Referring to FIG. 9, a circuit board 200a on which first and second circuit patterns 203 and 204 are formed, instead of the lead frame 200, may be employed. The first circuit pattern 203 is formed on a surface 201 and a rear side 202 of the circuit board 200a, and the first circuit pattern 203 that is formed on the surface 201 of the circuit board 200a and the first circuit pattern 203 that is formed on the rear side 202 of the circuit board 200a are electrically connected to each other via a conductive via 205 that passes through the circuit board 200a. Likewise, the second circuit pattern 204 is formed on the surface 201 and the rear side 202 of the circuit board 200a, and the second circuit pattern 204 that is formed on the surface 201 of the circuit board 200a and the second circuit pattern 204 that is formed on the rear side 202 of the circuit board 200a are electrically connected to each other via a conductive via 206 that passes through the circuit board 200a. A light-emitting device chip 300 is mounted on the surface 201 of the circuit board 200a. The light-emitting device chip 300 may be attached to the surface 201 of the circuit board 200a. An anode and a cathode of the light-emitting device chip 300 are connected to the first and second circuit patterns 203 and 204, respectively, via the bonding wires 301 and 302.

Next, a space formed by the bonding wires 301 and 302 is separated from the outside by using a light-transmitting cap member 500. An encapsulation layer 400 formed of a light-transmitting resin, such as silicon or the like, is formed on the light-transmitting cap member 500. In order to realize a light-emitting device package 1 having a wide directional angle, bubbles 401 may be dispersed in the encapsulation layer 400. In addition, a fluorescent substance that converts light emitted from the light-emitting device chip 300 into a predetermined light color may be included in the encapsulation layer 400. The encapsulation layer 400 may include the first encapsulation layer 410 having the bubbles 401 and the second encapsulation layer 420 that is disposed on the first encapsulation layer 401 and having no bubbles 401, as illustrated in FIG. 2. In this case, a fluorescent substance may be included in at least one of the first and second encapsulation layers 410 and 420. Shapes of the encapsulation layer 400 and the light-transmitting cap member 500 are not limited to a doom shape illustrated in FIG. 9.

A fluorescent layer 600 including a fluorescent substance may be formed on the light-emitting device chip 300. In addition, a fluorescent layer 600a having a refractive index that is between a refractive index of the light-emitting device chip 300 and a refractive index of air and serves as a refractive index-matching material may be employed. The fluorescent layers 600 and 600a may be formed to cover sides of the light-emitting device chip 300, as indicated by a dotted line.

Figure 10:
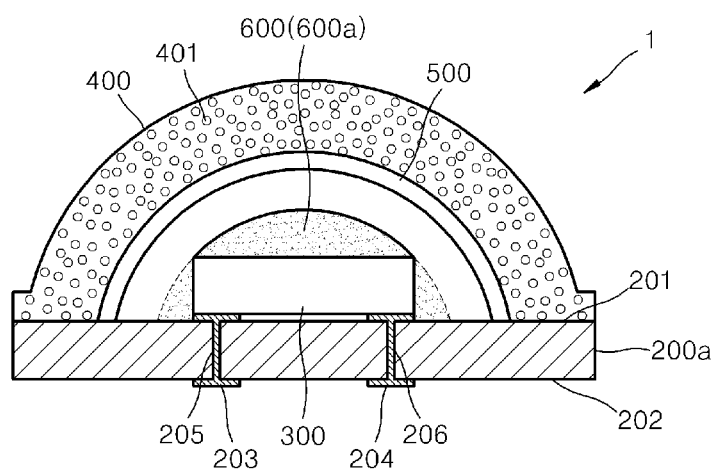
FIG. 10 is a cross-sectional view of a light-emitting device package having no bonding wires according to another embodiment of the present invention.

FIG. 10 illustrates a light-emitting device package 1 having no bonding wires 301 and 302 according to another embodiment of the present invention. Referring to FIG. 10, an anode and a cathode of the light-emitting device chip 300 are electrically directly connected to first and second circuit patterns 203 and 204 that are formed on the surface 201 of the circuit board 200a. Other structure than the above-described structure is the same as the structure of FIG. 9 and thus, descriptions thereof will be omitted.

Figure 11:
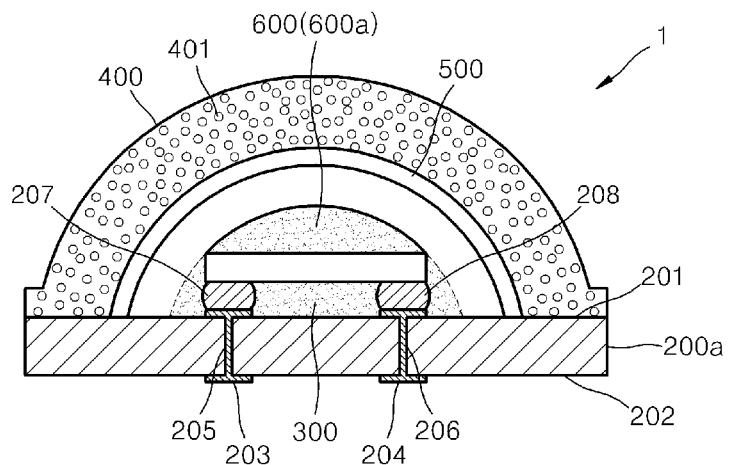
FIG. 11 is a cross-sectional view of a light-emitting device package having no bonding wires according to another embodiment of the present invention.

FIG. 11 illustrates a light-emitting device package 1 having no bonding wires 301 and 302 according to another embodiment of the present invention. In the light-emitting device package 1 illustrated in FIG. 11, the light-emitting device package 1 is flip-chip-bonded by disposing solder bumps 207 and 208 on each of first and second circuit patterns 203 and 204 that are formed on a circuit board 200a. Other structure than the above-described structure is the same as the structure of FIG. 9 and thus, descriptions thereof will be omitted.

Figure 12:
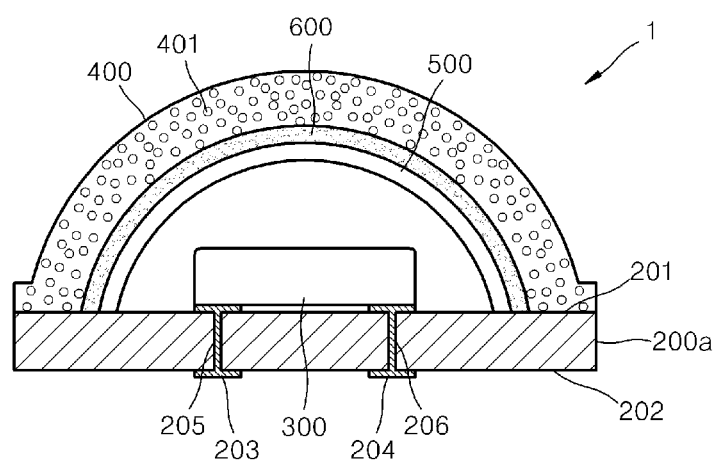
FIG. 12 is a cross-sectional view of a modified example of the light-emitting device package having no bonding wires illustrated in FIG. 10.

FIG. 12 is a modified example of the light-emitting device package illustrated in FIG. 10, wherein a fluorescent layer 600 is disposed between a light-transmitting cap member 500 and an encapsulation layer 400. Although not shown, a refractive index-matching layer 600a that covers a light-emitting device chip 300 may be further employed. The encapsulation layer 400 may also serve as the fluorescent layer 600 by dispersing a fluorescent substance in the encapsulation layer 400, instead of the fluorescent layer 600. This structure may also apply to the light-emitting device package illustrated in FIG. 11.

According to the structure illustrated in FIGS. 10 through 12, since the light-emitting device chip 300 and the encapsulation layer 400 are separated from each other by the light-transmitting cap member 500, thermal expansion and contraction of the encapsulation layer 400 does not affect electrical connection between the light-emitting device chip 300 and the first and second circuit patterns 203 and 204 so that operation stability of the light-emitting device chip may be improved.

As described above, according to the one or more of the above embodiments of the present invention, a light-emitting device package may have the following effects.

First, bonding wires and a light-transmitting encapsulation layer are separated from each other by using a light-transmitting cap member so that stress on the boding wires due to a difference in thermal expansion coefficients may be reduced. Thus, a light-emitting device package in which stable emission may be performed during a life-span of the light-emitting device package may be implemented to have high reliability.

Second, light-emitting efficiency can be improved by employing a refractive index-matching layer between a space in which the bonding wires are installed and a light-emitting device chip.

Third, light is scattered by including bubbles in an encapsulation layer so that a light-emitting device package having a wide directional angle may be implemented. In addition, even when a lens or a diffusion plate is further employed so as to widen a directional angle of light, a degree of freedom for optimizing the performance of the lens or diffusion plate may be increased. Furthermore, due to the scattering, directivity of light is reduced and thus a dazzling phenomenon is reduced.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A light-emitting device package, comprising:
    a package main body comprising a cavity and a lead frame comprising a mounting portion disposed in the cavity and a plurality of terminal portions;
    a light-emitting device chip disposed on the mounting portion;
    a plurality of bonding wires for electrically connecting the plurality of terminal portions and the light-emitting device chip;
    a light-transmitting encapsulation layer filled in the cavity; and
    a light-transmitting cap member disposed in the cavity and dividing the cavity into an upper space filled with the light-transmitting encapsulation layer and a lower space free of the light-transmitting encapsulation layer such that the plurality of bonding wires and the light-emitting device chip are disposed in the lower space.

2. The light-emitting device package of claim 1, wherein the encapsulation layer includes a fluorescent substance that converts light emitted from the light-emitting device chip into a predetermined light color.

3. The light-emitting device package of claim 1, wherein the encapsulation layer includes bubbles.

4. The light-emitting device package of claim 1, wherein the encapsulation layer comprises:
    a first encapsulation layer disposed on an upper portion of the light-transmitting cap member and including bubbles, and
    a second encapsulation layer disposed on the first encapsulation layer and including no free of bubbles.

5. The light-emitting device package of claim 4, wherein a fluorescent substance that converts light emitted from the light-emitting device chip into a predetermined light color is included in at least one of the first and second encapsulation layers.

6. A light-emitting device package, comprising:
    a package main body comprising a lead frame and an upper frame having a cavity, the lead frame comprising a mounting portion forming a lower structure of the cavity and a plurality of terminal portions;
    a light-emitting device chip disposed on the mounting portion and electrically connected to the plurality of terminal portions via a plurality of bonding wires;
    a light-transmitting cap member dividing the cavity into a lower space occupied by the plurality of bonding wires and filled with air and an upper space above the lower space; and
    a refractive index-matching layer disposed on an upper surface of the light-emitting device chip and having a refractive index that is smaller than a refractive index of the light-emitting device chip and greater than a refractive index of air.

7. The light-emitting device package of claim 6, wherein a fluorescent substance that converts light emitted from the light-emitting device chip into a predetermined light color is dispersed into the refractive index-matching layer.

8. The light-emitting device package of claim 6, further comprising a light-transmitting encapsulation layer disposed in the upper space.

9. The light-emitting device package of claim 8, wherein the light-transmitting encapsulation layer includes a fluorescent substance that converts light emitted from the light-emitting device chip into a predetermined light color.

10. The light-emitting device package of claim 8, wherein the light-transmitting encapsulation layer includes bubbles.

11. The light-emitting device package of claim 8, wherein the encapsulation layer comprises:
    a first encapsulation layer disposed on an upper portion of the light-transmitting cap member and including bubbles, and
    a second encapsulation layer disposed on the first encapsulation layer and free of bubbles.

12. The light-emitting device package of claim 11, wherein a fluorescent substance that converts light emitted from the light-emitting device chip into a predetermined light color is included in at least one of the first and second encapsulation layers.

13. A light-emitting device package, comprising:
    a package main body comprising an upper frame and a lead frame having a mounting portion and a plurality of terminal portions;
    a light-transmitting cap member contacting an inner surface of the upper frame defining a cavity in the package main body and dividing the cavity into an upper space and a lower space;
    a light-emitting device chip disposed on the mounting portion in the lower space of the cavity;
    a plurality of bonding wires for electrically connecting the plurality of terminal portions and the light-emitting device chip in the lower space of the cavity; and
    a light-transmitting encapsulation layer filling at least a portion of the upper space of the cavity.

* * * * *